(12) United States Patent
Harpe

(10) Patent No.: US 8,896,476 B2
(45) Date of Patent: Nov. 25, 2014

(54) DATA-DRIVEN NOISE REDUCTION TECHNIQUE FOR ANALOG TO DIGITAL CONVERTERS

(71) Applicant: Technische Universiteit Eindhoven, Eindhoven (NL)

(72) Inventor: Pieter Joost Adriaan Harpe, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 14/163,560

(22) Filed: Jan. 24, 2014

(65) Prior Publication Data

US 2014/0210653 A1 Jul. 31, 2014

Related U.S. Application Data

(60) Provisional application No. 61/756,619, filed on Jan. 25, 2013.

(51) Int. Cl.
*H03M 1/08* (2006.01)
*H03M 1/06* (2006.01)
*H03M 1/02* (2006.01)
*H03M 1/38* (2006.01)
*H03M 1/12* (2006.01)

(52) U.S. Cl.
CPC ............. *H03M 1/0697* (2013.01); *H03M 1/08* (2013.01); *H03M 1/02* (2013.01); *H03M 1/38* (2013.01); *H03M 1/12* (2013.01)
USPC .......................................... 341/163; 341/118

(58) Field of Classification Search
CPC ............ H03M 1/0656; H03M 1/0658; H03M 1/0675; H03M 1/0697; H03M 1/08; H03M 1/38–1/468

USPC .................................. 341/155, 161–163, 172
See application file for complete search history.

(56) References Cited

U.S. PATENT DOCUMENTS 3,780,274 A * 12/1973 Thompson et al. ............ 702/117
5,057,841 A 10/1991 Schuurmans et al.
(Continued)

FOREIGN PATENT DOCUMENTS

JP 03185927 A * 8/1991
WO WO 99/04496 A1 1/1999

OTHER PUBLICATIONS

Shirvastava, 12-bit non-calibrating noise-immune redundant SAR ADC for System-on-a-chip, 2006 IEEE International Symposium on Circuits and Systems, ISCAS 2006, May 2006, Publisher: IEEE, pp. 1515-1518.*

(Continued)

*Primary Examiner* — Howard Williams
(74) *Attorney, Agent, or Firm* — Lumen Patent Firm

(57) ABSTRACT

A successive operation register (SAR) analog-to-digital converter (ADC) circuit includes a bit reliability circuit that detects a delay time of the voltage comparator and, if the detected delay time is greater than a delay threshold time $\tau_{MV}$, outputs a bit reliability decision signal; a digital noise reduction circuit that is selectively activated if the bit reliability decision signal indicates the detected delay time is greater than the delay threshold time $\tau_{MV}$ and produces a noise-reduced decision output that supersedes the decision output of the voltage comparator. In a preferred embodiment, the digital noise reduction circuit uses a multiple voting logic to produce a majority vote value as the noise-reduced decision output.

6 Claims, 8 Drawing Sheets

Segmented DAC: 4b thermometer + 8b binary

(56) References Cited

U.S. PATENT DOCUMENTS 8,749,412 B1 * 6/2014 Tsai ............................. 341/118
2013/0194121 A1 * 8/2013 Piasecki ....................... 341/172

OTHER PUBLICATIONS

Chenet et al., Design Diversity Redundancy With Spatial-Temporal Voting Applied to Data Acquisition Systems, 2014 15th Latin American Test Workshop—LATW, Mar. 2014, Publisher: IEEE.*

T. Morie, et al. "A 71 dB-SNDR 50MS/s 4.2 mW CMOS SAR ADC by SNR enhancement techniques utilizing noise," in IEEE ISSCC Dig. Tech. Papers, Feb. 17-21, 2013, pp. 272-273.

Giannini et al., "An 820μW 9b 40MS/s Noise-Tolerant Dynamic-SAR ADC in 90nm Digital CMOS," Solid-State Circuits Conference, 2008. ISSCC 2008. Digest of Technical Papers. IEEE International, pp. 238-610, Feb. 3-7, 2008.

Harpe, P. et al., "A 0.7V 7-to-10bit 0-to-2MS/s flexible SAR ADC for ultra low-power wireless sensor nodes," ESSCIRC (ESSCIRC), 2012 Proceedings of the, pp. 373-376, Sep. 17-21, 2012.

Harpe, P. et al., "A 2.2/2.7fJ/conversion-step 10/12b 40kS/s SAR ADC with Data-Driven Noise Reduction," ISSCC 2013 / Session 15 / Data Converter Techniques. Feb. 2013.

Harpe, P. et al., "A 10b/12b 40 kS/s SAR ADC With Data-Driven Noise Reduction Achieving up to 10.1b ENOB at 2.2 fJ/Conversion-Step," IEEE J. Solid-State Circuits, vol. 48, No. 12 (Dec. 2013).

Ahmadi, M. et al., "A 3.3fJ/conversion-step 250kS/s 10b SAR ADC using optimized vote allocation," Custom Integrated Circuits Conference (CICC), 2013 IEEE, Sep. 22-25, 2013.

* cited by examiner

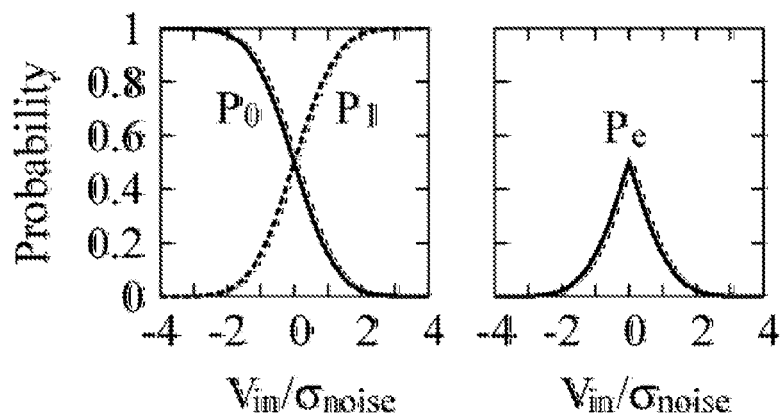
Fig. 1A   Fig. 1B
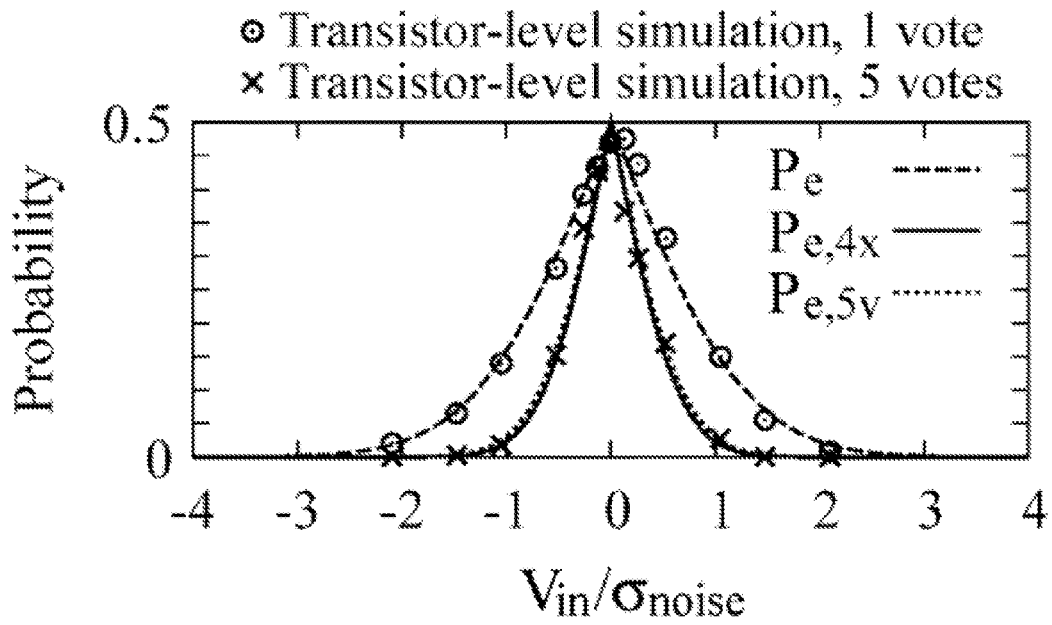
Fig. 2

① Fast decision: accept comparator result and switch DAC to next level
② Slow decision: vote on 5 results, then switch DAC to next level

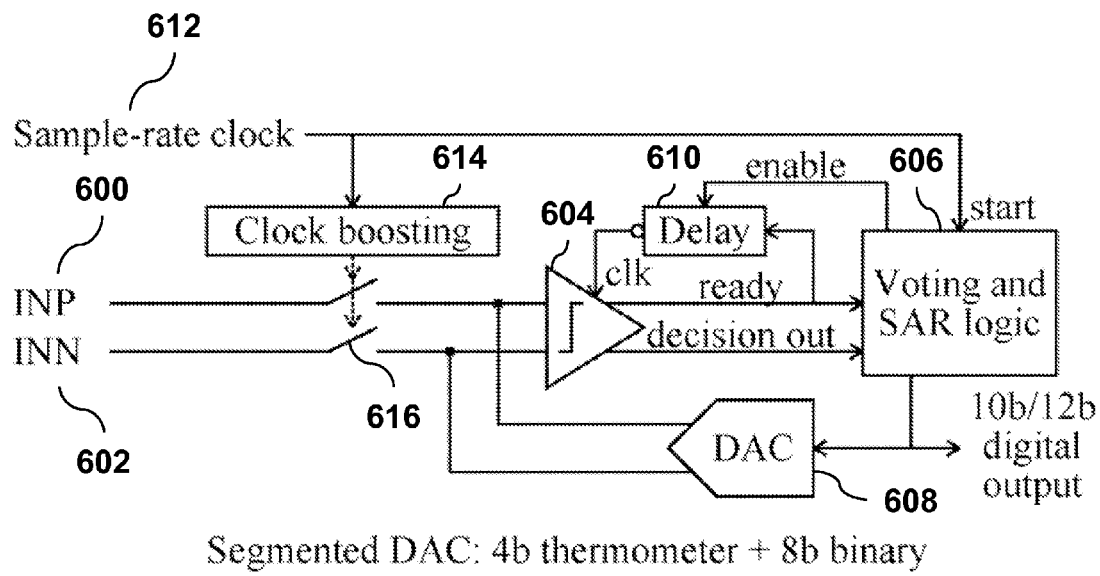
*Fig. 6*
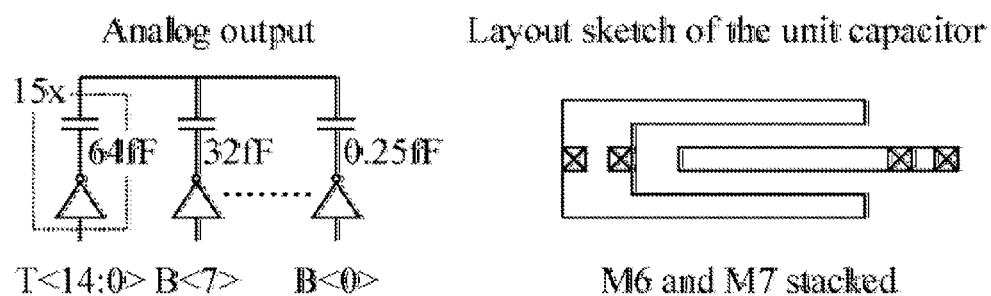
*Fig. 7A*  *Fig. 7B*

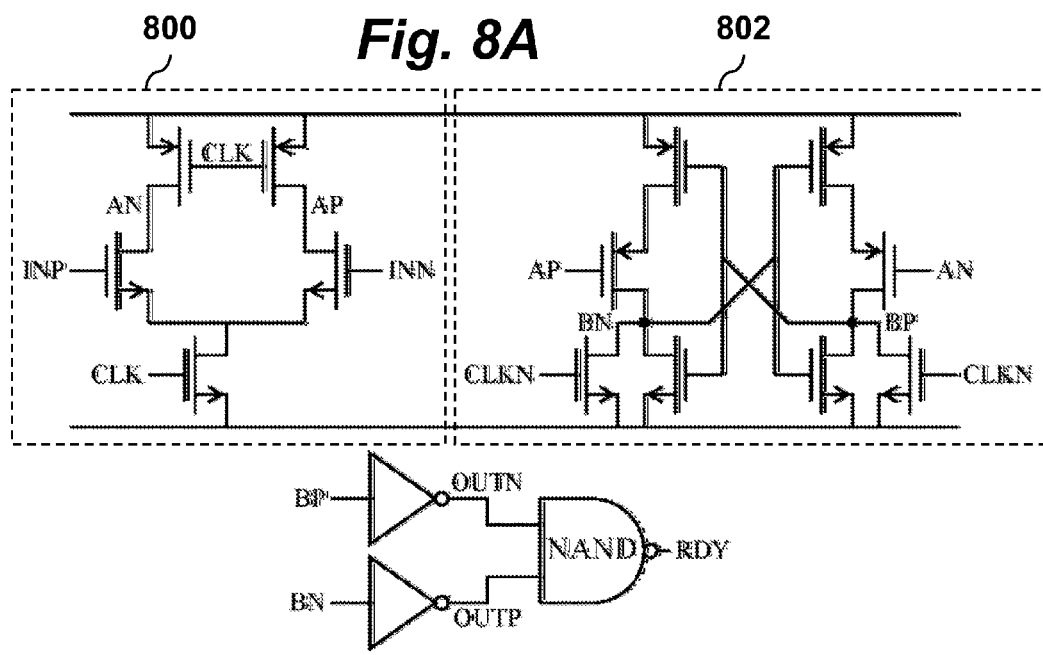
Fig. 8A
Fig. 8B
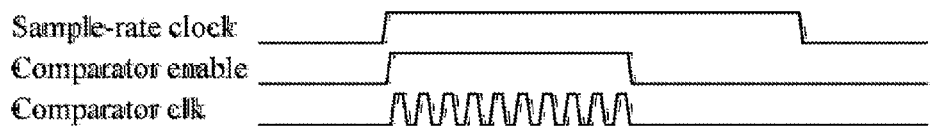
Fig. 9

DATA-DRIVEN NOISE REDUCTION TECHNIQUE FOR ANALOG TO DIGITAL CONVERTERS

CROSS-REFERENCE TO RELATED APPLICATIONS

This application claims priority from U.S. Provisional Patent Application 61/756619 filed Jan. 25, 2013, which is incorporated herein by reference.

FIELD OF THE INVENTION

The present invention relates generally to analog-to-digital converters. More specifically, it relates to successive operation register (SAR) analog-to-digital converter (ADC) circuits that provide an improved combination of power efficiency and accuracy.

BACKGROUND OF THE INVENTION

ADCs are core circuits in a vast array of electronic devices. Low power ADC design is special importance for applications with low-power, high accuracy constraints.

The power consumption of a conventional analog-to-digital converter (ADC) increases rapidly as a function of its accuracy. Since accuracy is desirable while power consumption is not, current ADC solutions are faced with a trade-off of either spending more power to get a higher accuracy, or by accepting a lower accuracy with a smaller power budget.

To address this limitation, some researchers have proposed ADC designs with lower power. Nevertheless, more efficient solutions are needed that provide an ADC that has less power consumption for the same accuracy (or, equivalently, more accuracy for the same power consumption) as prior art designs.

SUMMARY OF THE INVENTION

The present invention provides, in one aspect, SAR ADCs with improved accuracy and power-efficiency. Inside low-power successive approximation (SAR) ADCs, the comparator becomes dominant for the overall power when considering higher resolutions. The comparator decides a set of digital output bits that describes the analog input signal. In high-resolution (i.e., greater than 10-bit) ADCs the power consumption is driven by thermal noise constraints (every 6 dB increase in resolution comes at the cost of a 4-fold increase in power consumption). To overcome this fundamental scaling rule, the inventor discovered a Data-Driven Noise-Reduction technique (DDNR) to efficiently suppress comparator noise by means of selective noise enhancement. More specifically, in addition to determining the bits themselves, there is circuitry to determine the reliability of each individual bit being converted. Based on the reliability, a decision logic for each bit-decision either keeps the bit as it is (if the bit appears to be reliable enough), or activates a noise reduction scheme that enhances the reliability of this individual bit (if the bit is not reliable enough). In one embodiment, the noise-reduction scheme repeats the same comparator operation multiple times and uses majority-voting to decide the final output, thereby improving the reliability of the determined bit. Alternatively, other noise-reduction schemes such as oversampling, noise-shaping or sigma-delta modulation may be used instead. Advantageously, because it is implemented in the digital domain, the noise-reduction scheme can be reconfigured by hardware or software, dynamically and/or adaptively, to adjust the amount of noise-reduction. In this way, a flexible trade-off between power and accuracy can be made after production of the ADC. Advantageously, the noise reduction scheme is selective (i.e., only applied for unreliable bit conversions), so it is much more power efficient compared to traditional unselective methods.

The level of performance achievable by embodiments of this invention exceeds state-of-the-art-implementations by providing both higher accuracy and lower power consumption. The best prior-art design has achieved performance of 2.8 fJ/conversion-step. Embodiments of the present invention, in contrast, provide an achieved performance of 2.2 fJ/conversion-step, which represents almost 25% power reduction. At the same time, an accuracy improvement of 5 dB is achieved.

In one aspect, the invention provides a successive operation register (SAR) analog-to-digital converter (ADC) circuit that includes a voltage comparator having a first analog signal input, a second analog input, and a decision output; a decision logic circuit having an input connected to the decision output of the voltage comparator and a digital output; a digital-to-analog converter (DAC) having a digital input connected to the digital output of the decision logic circuit and an analog output connected to the second analog input of the voltage comparator. The ADC circuit further includes a bit reliability circuit that detects a delay time of the voltage comparator and, if the detected delay time is greater than a delay threshold time $\tau_{MV}$, outputs a bit reliability decision signal; a digital noise reduction circuit that is selectively activated if the bit reliability decision signal indicates the detected delay time is greater than the delay threshold time $\tau_{MV}$ and produces a noise-reduced decision output that supersedes the decision output of the voltage comparator.

In a differential implementation, the digital-to-analog converter (DAC) may also have a second analog output connected to the first analog input of the voltage comparator.

The digital noise reduction circuit may use a multiple voting logic to produce a majority vote value as the noise-reduced decision output, and may further include an oscillation circuit that generates a variable over-sampled clock signal for the multiple voting logic. The digital noise reduction circuit may be configurable in a number of repeated votes (Nv) per bit decision used in the voting logic and a number of voting cycles (Nc) per conversion used in the voting logic, and the ADC may include a feedback circuit that controls $\tau_{MV}$ of the bit reliability circuit based in part on the number of voting cycles (Nc) per conversion.

BRIEF DESCRIPTION OF THE DRAWINGS

FIGS. 1A and 1B are graphs of comparator output probabilities ($P_0$ and $P_1$) and error probability ($P_e$), respectively, with respect to the ratio of signal input to comparator noise, according to an embodiment of the invention.

FIG. 2 show graphs of the error probability of an initial comparator ($P_e$), after 4 times analog scaling ($P_{e,4x}$) and after 5 times majority voting ($P_{e,5v}$) with respect to the ratio of signal input to comparator noise, according to an embodiment of the invention. Also shown are transistor-level transient-noise simulation error probabilities of a comparator without voting and after 5 times voting.

FIG. 6 is a circuit diagram illustrating a SAR ADC architecture with segmented DAC and self-oscillating comparator, according to an embodiment of the invention.

FIGS. 7A and 7B are circuit diagrams illustrating a segmented charge-redistribution DAC, according to an embodiment of the invention.

FIGS. 8A and 8B are circuit diagrams illustrating a comparator implementation with "Comparison Ready"-output (RDY), according to an embodiment of the invention.

FIG. 9 is a timing diagram illustrating bit-cycling clock generation, according to an embodiment of the invention.

DETAILED DESCRIPTION

Figure 3:
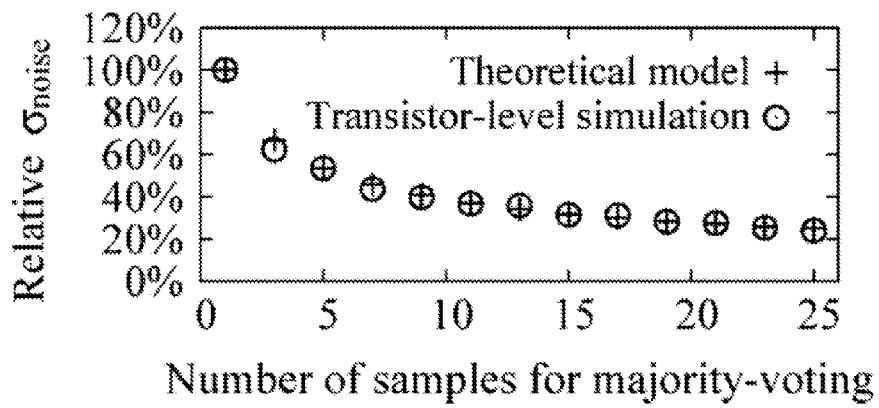
FIG. 3 is a graph of relative equivalent comparator noise as a function of the number of samples in the voting scheme, comparing a theoretical model and transistor-level transient-noise simulations, according to an embodiment of the invention.

It is difficult to maintain power-efficiency of SAR ADCs when extending the resolution beyond 10 bit because the power consumption of the analog components increases by a factor of 4 for each additional 6 dB of signal-to-noise-and-distortion ratio (SNDR) (equivalent to 1 bit gain in effective number of bits). Because the comparator usually dominates the power consumption, the present invention provides techniques that scale down the comparator noise in a much more power-efficient way as compared to the conventional approaches. Before this method is explained, a digital majority-voting technique is discussed as an alternative to analog scaling.

Majority Voting

A comparator with an input-referred noise with standard deviation $\sigma_{noise}$ has an output probability function, such as shown in FIG. 1A, where $P_0$ denotes the probability of output 0 as function of the input voltage $V_{in}$ and $P_1$ denotes the probability of output 1 as function of the input voltage $V_{in}$. (A differential implementation is assumed here, with a comparator reference voltage at $V_{in}=0$ Volts.) $P_0$ and $P_1$ are determined by the Cumulative Distribution Function (CDF). Assuming a Gaussian distribution of the input-referred noise, the CDF is given by:

$$CDF(V_{in})=1/2[1+erf)V_{in}(2\sigma^2_{noise})^{-1/2})] \quad (1)$$

and $P_0$ and $P_1$ are given by:

$$P_0(-V_{in})=P_1(V_{in})=CDF(V_{in}) \quad (2)$$

From $P_0$ and $P_1$, the error probability $P_e$, (i.e., the probability that the comparator takes the wrong decision) can be deducted as:

$$P_e(V_{in})=CDF(-|V_{in}|) \quad (3)$$

For illustration, $P_e$ is shown in FIG. 1B. As can be seen, $P_e$ approximates zero for $|V_{in}|\gg\sigma_{noise}$, which logically means that the comparator makes no mistakes when the magnitude of the input signal $V_{in}$ is sufficiently large as compared to the noise level.

When the same comparator is used several times to repeat the same decision on a given input signal $V_{in}$, a majority-voting logic can be applied on the obtained output decision samples to decide a final output. Using more samples (i.e., more votes) increases the probability that the majority decision is correct. As an example, FIG. 2 compares the error probability of an initial comparator ($P_e$) with the performance after a 5-fold voting ($P_{e,5v}$). For reference, the error probability using 4-fold analog scaling is also shown ($P_{e,4x}$). In this example, the analog scaling and majority voting are similar in error performance. However, for the voting scheme, it is not always necessary to determine all 5 samples. For example, if the first 3 votes are all equal to 0, the last 2 samples can be omitted as the majority is already clear, thereby saving power. In addition to the theoretical model, the statistical results from a transistor-level transient-noise simulation (including 1/f noise) of the actual comparator used in this work are also shown in FIG. 2. The comparator has an input-referred noise of $\sigma_{noise}=305$ µV, which is reduced to 163 µV after 5 times voting in agreement with the theoretical model. In this implementation, the comparator is a fully dynamic circuit. This ensures uncorrelated votes as potential memory effects and 1/f-noise are suppressed by the dynamic operation.

Analogous to the example for 5 samples, one can determine the error probability and the corresponding effect on $\sigma_{noise}$ for any given number of samples. This is illustrated in FIG. 3, which confirms that voting on 5 samples will reduce the effective noise to about 50% of the original value, while voting on 25 samples will decrease it to about 25%, similar to 16 times analog scaling. As can be seen, the theoretical model closely matches the transistor-level simulations.

Consequently, the power consumption of the majority-voting scheme with 5 samples is similar to the power consumption of the equivalent analog-scaling method (4 times), while the error probability is similar in both cases too. Also note that in an actual SAR ADC, the majority voting not only reduces the impact of the noise from the comparator, but also reduces the impact of the noise from the feedback DAC. However, this work focuses on the comparator noise, which is more critical for the overall performance.

Data-Driven Operation

The majority-voting procedure alone does not yet have a major impact on the achievable ADC performance. However, it offers flexibility as the amount of noise reduction can be dynamically adjusted simply by changing the number of samples used to determine the majority decision. This can be used advantageously as the noise requirement for the comparator is not identical for each bit-decision in the SAR algorithm: only in one comparison cycle is the amplitude of the input signal $V_{in}$ to the comparator less than 0.5 LSB. Similarly, there is only one cycle in which $|V_{in}|$ is between 0.5 LSB and 1 LSB, one case where it is between 1 LSB and 2 LSB, and so on. Using this known variation of the amplitude of $V_{in}$, the noise requirement for the comparator changes correspondingly: the requirement is most critical in one case only, while it becomes more and more relaxed for the other cases. Taking advantage of this knowledge, embodiments of the invention are able to save power by adjusting the comparator noise performance depending on the amplitude of $V_{in}$. Thus, a technique is used to provide flexible noise-performance, and another technique is used to estimate the amplitude of $V_{in}$.

Flexible noise-performance can be implemented conveniently based on majority voting: the voting scheme can be instantaneously enabled in the noise critical case(s) to reduce the noise, whereas the voting scheme can be disabled during the remaining cases to save power. To estimate the potential power savings of such a scheme, a 12 bit SAR ADC is considered as an example. To reduce the noise level of the comparator in such an ADC by 2 times, permanent analog scaling would need 4 times scaling of the comparator, leading to a power-consumption increase of 300%. With a flexible majority-voting system, 5 times voting will be sufficient to get a similar noise reduction. If the voting is enabled only in one cycle, the total number of comparisons is 5+11=16 instead of 12. Thus, the power increase is only 33% as opposed to the 300% of the conventional analog-scaling method.

A technique is also used to estimate the amplitude of $V_{in}$, such that the most noise-critical cycle can be detected, which is not known before-hand. To automatically detect this, the comparator decision-time can be observed, as this decision time is inversely related to the amplitude of the input signal. If the decision-time is longer than a certain threshold-time $\tau_{MV}$, this implies that the input signal is smaller than a certain threshold voltage $V_{MV}$. In this way, the method can detect whether a decision is noise-critical or not. The threshold for being noise-critical can be set by tuning the delay $\tau_{MV}$ to achieve a desired $V_{MV}$.

Figure 4:
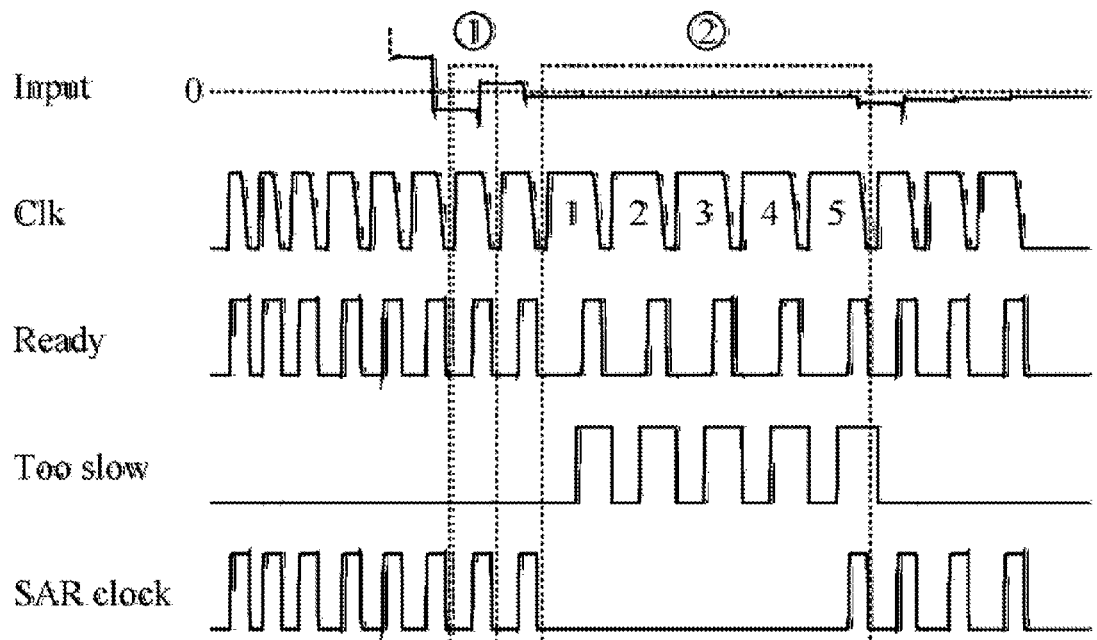
FIG. 4 is a timing diagram of a 12 bit SAR conversion with Data-Driven Noise Reduction (DDNR) according to an embodiment of the invention.

The technique is called Data-Driven Noise Reduction (DDNR) because it selectively applies noise reduction by means of majority voting, dependent on the input data (i.e., the amplitude information of $V_{in}$). The timing diagram of a 12-bit SAR conversion with DDNR is illustrated in FIG. 4: the comparator Clk initiates each comparison. Together with the result of the comparison, the comparator also generates a Ready indication as soon as the decision is made by the comparator. As shown by situation 1 in FIG. 4, if the Ready indication occurs fast enough, the comparator output is immediately accepted without majority voting as the input signal is apparently sufficiently large. In case the circuitry detects that the comparator decision is too slow (situation 2 in the figure), the decision may be corrupted by noise. Thus, the decision is postponed, 4 additional comparisons are performed, and majority voting is applied to the 5 samples to obtain the majority decision while suppressing the noise. The clock for the SAR logic normally follows the comparator Ready signal to control the bit-cycling operations. However, in case of voting, the SAR clock is suspended until the majority decision is reached and the next bit cycle can be activated.

DDNR Behavioral-Model Simulations

In this section, several simulation results on a behavioral model of a 12-bit SAR ADC with DDNR are discussed. The behavioral model in MATLAB includes an ideal 12 bit quantizer, complemented by a majority-voting scheme and an ideal amplitude-detector for selective noise reduction. Note that in this simplified behavioral model, the amplitude of the comparator input signal $V_{in}$ is determined directly and compared against a threshold $V_{MV}$ to decide whether or not the majority-voting scheme will be applied. As mentioned previously, the actual circuit implementation will do this detection indirectly through observing the comparator delay.

Three noise sources are included during the simulations: quantization noise, sampling noise and comparator noise. The sampling noise is set to 0.289 LSB, thus being equal to the quantization noise. The comparator noise $\sigma_{noise}$ was set to a fraction $\alpha$ of the LSB:

$$\sigma_{noise} = \alpha \text{LSB} \qquad (4)$$

where $\alpha$ was set to either ¼, ½, or 1 during the simulations.

Figure 5A:
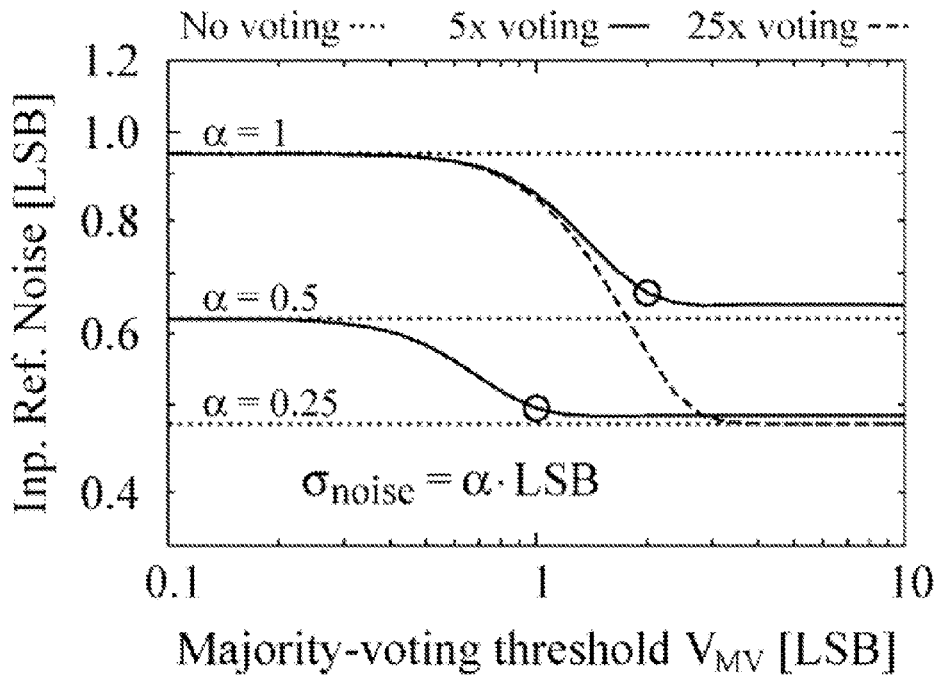
FIGS. 5A and 5B are graphs of simulated ADC input-referred noise and number of extra comparisons, respectively, versus majority-voting threshold for various amounts of comparator noise ($\sigma_{noise}\alpha$ LSB), according to an embodiment of the invention.

Either 5 or 25 samples were used for majority-voting. For each case, a transient simulation was performed with a full-scale sine-input and with $10^6$ data-points. From each simulation, the overall Input-Referred Noise (IRN) of the ADC was determined. Moreover, the average number of extra comparisons per 12 bit conversion was logged as it gives an indication of how much additional power consumption will be needed. The results are summarized in FIG. 5A as a function of the threshold voltage $V_{MV}$, here quantified in LSBs. In the IRN-plot, the horizontal lines without voting indicate the performance of a conventional ADC without DDNR. When voting is applied, the IRN will become dependent on the selected threshold level, as the threshold decides when to apply voting or not. For low thresholds (i.e., almost no voting will be applied), the DDNR ADC logically performs identical to a conventional ADC with the same comparator noise. When the threshold is being increased, the IRN will gradually go down until it reaches the limit as expected based on the number of samples in the voting scheme: with 5 or 25 samples, the noise reduces equivalent to 4 times or 16 times analog scaling, respectively. This is confirmed from the figure as the DDNR ADC with, e.g., $\alpha=1$ approximates the performance of a conventional ADC with $\alpha=0.5$ when 5 votes are used and when the threshold setting is sufficiently high. Thus, it indeed performs similar to an analog design scaled by 4 times. When 25 votes are used, the curve approximates a conventional ADC with $\alpha=0.25$, equivalent to 16 times analog scaling. The circles in the figure indicate the points from whereon maximum noise reduction is obtained.

Figure 5B:
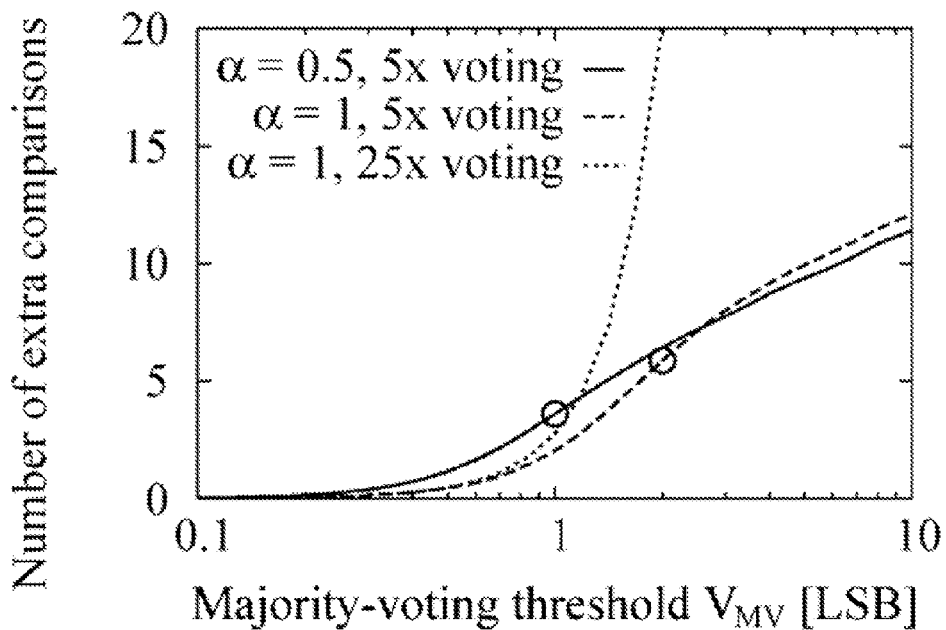

FIG. 5B illustrates the average number of additional comparisons per conversion (on top of the 12 nominal ones), which logically increases as the threshold is moved up. The circles in this plot (corresponding to the circles in the IRN plot) highlight that for 5-fold voting and for $\alpha=0.5$ or $\alpha=1$, about 4 or 6 additional comparisons are sufficient to get the maximum possible IRN-improvement. The number of additional comparisons is increasing with higher comparator noise (i.e., higher $\alpha$), which can be understood from the fact that more decisions will become noise-critical when there is more comparator noise. Thus, the voting threshold needs to be moved up to allow proper noise suppression in case of increased comparator noise. Nonetheless, the 4 or 6 additional comparisons lead to an increase of about 30% or 50% of the overall power consumption only, which is substantially below the +300% required by conventional analog scaling. For the situation with voting on 25 samples, the power consumption (at maximum attainable IRN) increases by a factor of 5, which is at least 3 times more efficient than the equivalent 16 times analog scaling.

SAR ADC Implementation

FIG. 6 shows an overview of a preferred embodiment of a SAR ADC with DDNR in accordance with the principles of the present invention. This particular implementation has differential inputs INP 600 and INN 602 to a comparator 604 whose decision output and ready signal are sent to voting and SAR logic circuit 606. A DAC 608 receives a digital output from the voting and SAR logic 606 and produces differential analog outputs that are also input to the differential inputs of the comparator 604. The voting and SAR logic 606 also generates an enable signal sent to a delay element 610 that is used to form an oscillation loop around the comparator 604 in order to generate the clock for the comparator 604 and for the voting and SAR logic 606. An external sample rate clock signal is input to the voting and SAR logic 606 as well as to a clock boosting circuit 614 that samples the inputs to the DAC

608. Strictly speaking, the input 602 is sampled on the DAC 608. Then, the DAC output including sampled input is applied to the comparator 604. The ADC of FIG. 6 operates at a single supply of 0.6 V, which is also used as the reference voltage for the DAC. To enable a large range of sensor applications, the ADC supports two resolutions (10 or 12 bit), and operates with sample rates from DC up to 40 kS/s. In 10 bit mode, the last two conversion cycles are simply omitted and the majority-voting logic is switched off to save power. Since the implemented circuits do not require static bias-currents, the power consumption will scale proportional to the sample rate. The DAC is implemented with a segmentation of 4 bit thermometer and 8 bit binary encoding. The logic implements the SAR and the majority-voting algorithms. These different components will be discussed in the following sections.

Segmented Charge-Redistribution DAC

The DAC 608 of FIG. 6 may be implemented using a 12 bit charge-redistribution DAC, as shown in the single-ended view of FIG. 7A. This same structure is implemented twice to compose a pseudo-differential DAC. The 8 LSBs are binary-encoded (B<7> ... B<0>) whereas the 4 MSBs are thermometer-encoded (T<14:0>), as will be explained later. The differential rail-to-rail input signal is sampled on the capacitors of the charge-redistribution DAC through clock-boosted sampling switches (616 of FIG. 6). The total capacitance of the DAC is 1 pF. As the input signal is directly sampled on this 1 pF capacitance, the SNR due to sampling noise is around 73 dB for a differential rail-to-rail input signal at 0.6 V supply. The unit capacitor for the LSB has to be as small as 250 aF to achieve an overall capacitance of 1 pF for 12 bit resolution. To implement such a small value, fringing capacitors are used as sketched in FIG. 7B. To increase the capacitor density, metal layers 6 and 7 are used in parallel. As the capacitors are custom made, there is no mismatch information available from the foundry. However, it is expected that the unit elements of 250 aF can have a matching with a standard deviation of 1%. This reasonably good matching for such a small capacitor is feasible as the equivalent capacitor area of 0.8 $\mu m^2$ is relatively large. A 1% matching is sufficient to keep the INL and DNL within 1 LSB of a 12 bit ADC.

This embodiment uses a segmented DAC in which the 4 MSBs are thermometer encoded while the remaining 8 LSBs are binary encoded. The thermometer encoding reduces the probability of large DNL errors as typically present in binary-scaled architectures. A second advantage of thermometer encoding over a binary-scaled array is that it reduces the switching activity and thus the DAC switching energy. More complicated DAC structures, such as a split-capacitor array, are not necessary because the power of the DAC is not dominant in this implementation. To limit the complexity of the binary-to-thermometer-encoding logic and to limit the wiring overhead, only the 4 MSBs are thermometer encoded. From simulations it is verified that the encoder logic requires less than 2% of the overall ADC power. Besides, the binary encoding of the 8 LSBs has little impact on power or accuracy.

In some embodiments, chopping and dithering may be applied in combination with oversampling to improve the linearity and to suppress the noise. Apart from suppressing DC offset and 1/f noise, chopping also modulates distortion components. Thus, by chopping at half the sampling rate and using over-sampling, also the dominant even-order distortions are moved out of the signal bandwidth. This helps in particular to counteract the even-order distortions due to mismatch in the thermometer-encoded MSBs. This may be implemented, for example, using boosted clocks and NMOS sampling switches. The output chopping may be performed in the digital domain and implemented with a MUX that selects the output data either from the non-inverted or from the inverted output of the SAR register. To reduce the distortion related to the binary part of the DAC, dithering is applied to randomize these errors. A deterministic dither sequence with 4 or 16 levels may be injected at the input of the ADC after sampling but before the actual AD conversion. The dither logic may be a simple counter to create the desired fixed sequence, and a 4-capacitor DAC adds the actual sequence to the sampling node.

Self-Oscillating Comparator

FIG. 8A shows the implemented comparator, using a dynamic pre-amplifier 800 followed by a dynamic latch 802. The dynamic pre-amplifier 800 amplifies the differential input voltage INP, INN to an intermediate differential signal AP, AN. This amplified signal AP, AN is input to the dynamic latch stage 802 which, by means of positive feedback, creates the full-swing output BP, BN dependent on the sign of the input INP, INN. The final comparator output OUTP, OUTN is created by two inverters acting as signal buffers to BP, BN. The input-referred noise of the comparator is designed to be around 1 LSB in 12 bit mode, and thus equals 0.25 LSB in 10 bit mode. For 12 bit mode, majority voting on 5 samples will be employed to effectively reduce the comparator noise to 0.5 LSB. In 10 bit mode, the noise is already acceptable without majority voting.

As shown in FIG. 8B, a few logic gates are added to the comparator to generate an indicator RDY when the comparator reaches its decision. This ready indication is used both to control the majority-voting scheme and to generate an oversampled clock internally (see FIG. 6).

A SAR ADC uses an oversampled clock to perform the comparator operations, as well as to control the DAC and logic; furthermore this particular design will have a variable number of cycles per conversion because of the DDNR method. For simplicity of system integration, it is preferred to use a single fixed external sample-rate clock. A variable oversampled clock is then generated inside the chip by means of an oscillation loop around the comparator. This principle is summarized in FIG. 9: a rising edge of the external sample rate clock initiates the conversion process. The comparator is now enabled, which also enables the self-oscillation of the comparator. The self-oscillation produces a clock signal that can be used to generate the timing for the SAR logic. In this way, standard synchronous CMOS logic can be used internally, even though the ADC as a whole is asynchronous with respect to the external clock. As soon as the last conversion cycle has been carried out, the comparator-enable signal is switched off such that the oscillation and clock generation are suspended until the next conversion will be initiated.

Figure 10:
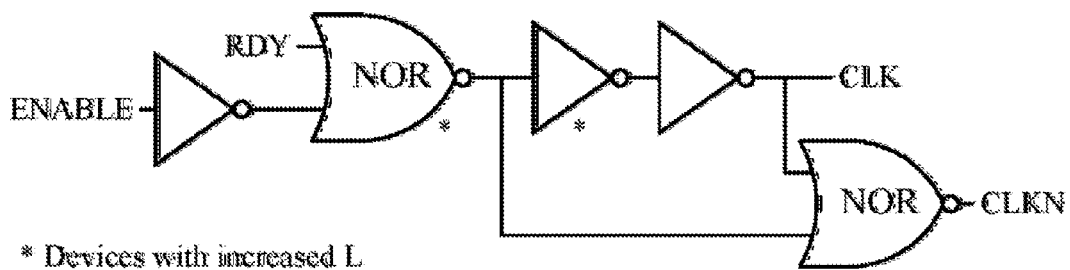
FIG. 10 is a circuit diagram illustrating a self-oscillation circuit that can be applied around the comparator, according to an embodiment of the invention.
Figure 11:
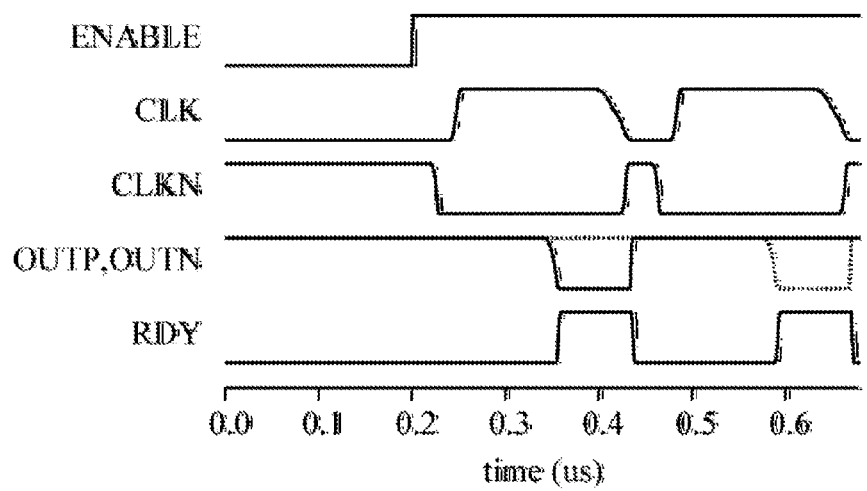
FIG. 11 is a timing diagram illustrating a simulation of the self-oscillating comparator at 0.6 V supply, according to an embodiment of the invention.

FIG. 10 shows the detailed implementation of the logic circuit that generates the comparator self-oscillation, and its behavior is given in FIG. 11. As long as the ENABLE-input is high, an inverted and delayed version of the comparison RDY signal is fed back to the comparator CLK input. In this way, the comparator starts self-oscillating and performs consecutive comparisons while generating the system clock at the same time. An additional NOR-gate is used to generate a non-overlapping CLKN which controls the latch-stage of the comparator. Further, several devices in the logic are intentionally made slower by increasing the length of the gates. This slows down the oscillation, such that there is sufficient time to reset the comparator, to allow for complete DAC settling, and to read out the data by the SAR logic. As the DAC settling is relatively fast thanks to the small capacitors (64 fF at most), and as the operation frequency of this ADC is relatively low (40 kS/s), it is straightforward to guarantee a sufficiently slow oscillation across all PVT corners.

Data-Driven Noise-Reduction Circuit

Figure 12:
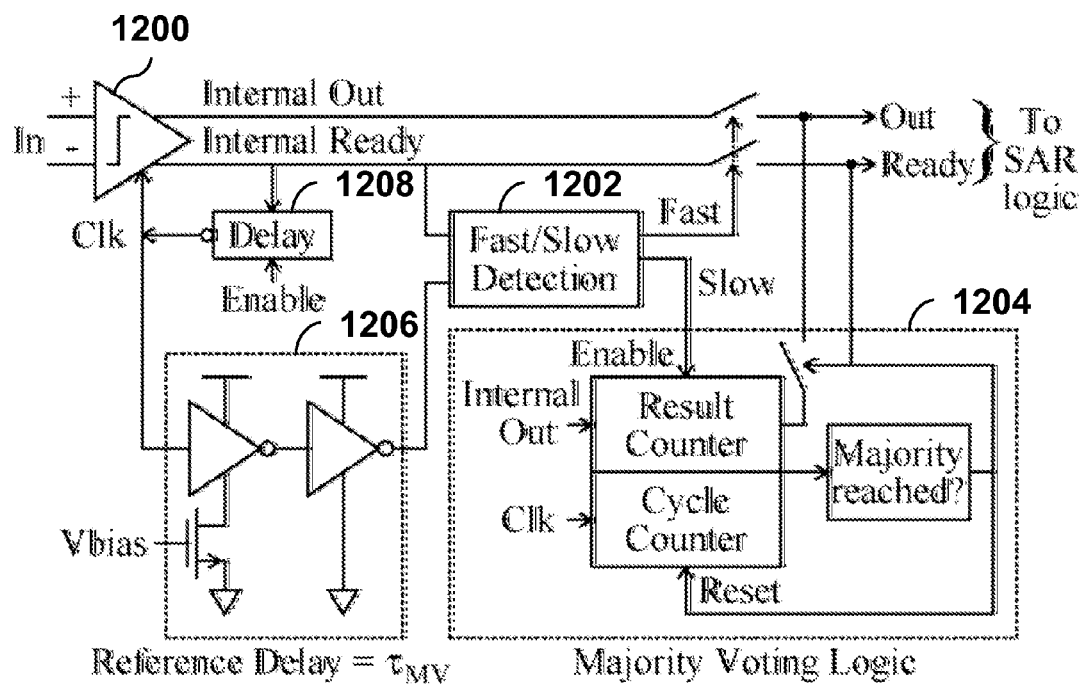
FIG. 12 is a circuit diagram illustrating an implementation of a Data-Driven Noise-Reduction method, according to an embodiment of the invention.

FIG. 12 shows details of the circuit implementation of the DDNR method within voting and SAR logic 606 of FIG. 6. A comparator 1200 generates internal Out and Ready signals which are either sent directly to the SAR logic or superseded by signals from the majority voting logic 1204, depending on the output of the fast/slow detection circuit 1202. In case the comparator is faster than the reference delay 1206, the output decision and ready indication from the comparator are directly forwarded to the SAR logic. If the comparator is too slow, then no information is given to the SAR logic, but the majority voting logic is activated instead. In one embodiment, a voting algorithm for 5 samples is implemented: a first counter counts the number of comparator cycles, while a second counter counts the test results. As soon as the majority is clear, which takes between 3 and 5 votes, the majority value is produced as final output to the SAR logic and the voting logic is reset. The voting logic also creates a Ready pulse to activate the SAR logic. Note that the final output data towards the logic (Out and Ready) is identical regardless whether it comes directly from the comparator or from the majority voting logic. Thus, the SAR logic itself does not need any modification to support DDNR. The fast/slow detector 1202 is implemented by a gated SR-latch and the voting logic 1204 is implemented with standard digital logic. A self-generated comparator clock Clk is created by a local feedback loop 1208 (as detailed in FIG. 10). At the same time, this Clk triggers a reference delay based on a current-starved inverter in circuit 1206. Circuit 1206 contains two inverters. One (on the left) is "current starved" by means of control voltage $V_{bias}$. A second one (on the right) is not current starved, but just an ordinary inverter added as a buffer.

The delay ($\tau_{MV}$) of the reference circuit 1206 determines a threshold voltage $V_{MV}$. If the input signal to the comparator is smaller than $V_{MV}$, the majority-voting scheme will be activated. The reference delay may be externally set by selecting a bias voltage $V_{bias}$. For autonomous operation and reliability under PVT variations, a feedback loop may be implemented that controls $V_{bias}$ based on the number of times the majority-voting is activated per conversion. The majority-voting should preferably be activated, e.g., once or twice per conversion, dependent on the desired performance improvement, the number of applied votes, and the comparator noise level (FIG. 5). By observing the number of actual activations in the digital domain, $V_{bias}$ can be tuned to an optimum value in which the number of actual activations converges to the desired number of activations.

The amount of noise reduction depends on two parameters: first, the number of votes (Nv) used in the voting process, as a higher number results in better noise averaging; and second, the number of voting cycles (Nc) per conversion. For example, when voting is only applied in the most noise-critical case, Nc equals 1. When voting is also applied in the second-most noise-critical case, Nc equals 2 and additional noise reduction is achieved.

Figure 13:
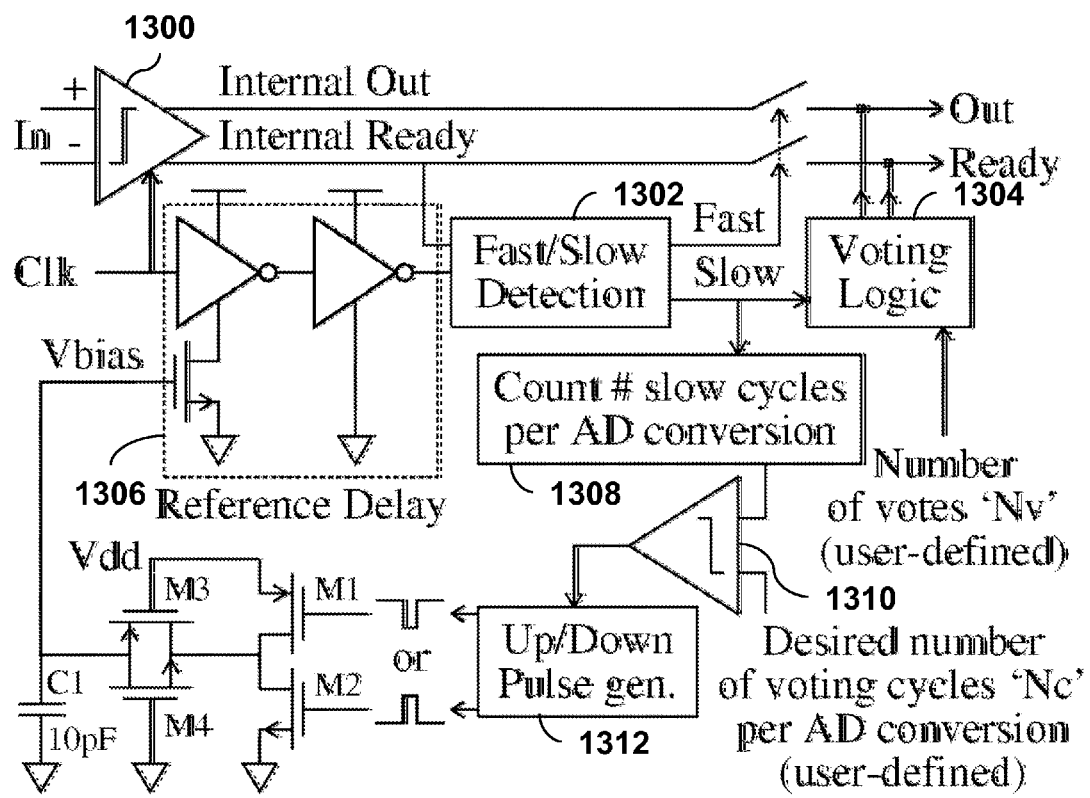
FIG. 13 is a circuit diagram illustrating an implementation of an adaptive Data-Driven Noise-Reduction method, according to an embodiment of the invention.

As shown in the embodiment of FIG. 13, a feedback loop around the DDNR may be used to enable reliable autonomous/adaptive operation. Just as in FIG. 12, comparator 1300 generates internal Out and Ready signals which are either sent directly to the SAR logic or superseded by signals from the majority voting logic 1304, depending on the output of the fast/slow detection circuit 1302 which is activated depending on reference delay 1306. In addition, this embodiment includes a feedback to the reference delay 1306 from an adaptive feedback circuit including a slow cycle counter 1308, digital comparator 1310, and up/down pulse generator 1312.

Moreover, the noise reduction is digitally programmable by setting the two critical parameters Nv and Nc. The value of Nv is input to the digital voting logic 1304 and used to count the number of repetitive decisions. The value of Nc is input into comparator 1310 and is used to control the reference delay by means of the feedback loop that drives $V_{bias}$. The actual number of voting cycles is determined by slow cycle counter 1308 which counts the number of times a slow, noise-critical decision is detected during a conversion. This number is compared at comparator 1310 against the desired value Nc. Dependent on the comparison result, $V_{bias}$ is either increased or decreased by a charge or discharge pulse on C1 through M1, M2. To achieve a slow time-constant in the loop without needing an excessively large capacitor C1, transistors M3 and M4 are added. These transistors are biased in sub-threshold and thus create a large RC constant for the loop.

The ADC with a majority-voting scheme using 5 votes may be fabricated in 65 nm CMOS and occupies an area of 0.076 $mm^2$, which includes the decoupling capacitors for the supply and reference voltage. It operates at 0.6 V supply and up to 40 kS/s. The power consumption is only 1 nW when sampling in 12 bit mode with a rate of 250 S/s, which can be sufficient for quasi-static environmental monitoring or simple bio-potential recordings. Compared to low-power SAR ADCs, the power efficiency of 2.2 fJ/conversion-step as well as the ENOB of 10.1 bit are better than previous work.

The DAC described above is a particular ultra low-power 10/12 bit 40 kS/s SAR ADC illustrating one embodiment of the invention. Those skilled in the art will appreciate that many implementation details may be altered or omitted while remaining within the scope of the Data-Driven Noise-Reduction techniques of the present invention. The DDNR method enables better power efficiencies at higher resolutions, as the comparator noise is selectively reduced.

The invention claimed is:

1. A successive operation register (SAR) analog-to-digital converter (ADC) circuit comprising:
   a voltage comparator having a first analog signal input, a second analog input, and a decision output;
   a decision logic circuit having an input connected to the decision output of the voltage comparator and a digital output;
   a digital-to-analog converter (DAC) having a digital input connected to the digital output of the decision logic circuit and an analog output connected to the second analog input of the voltage comparator;
   further comprising:
   a bit reliability circuit that detects a delay time of the voltage comparator and, if the detected delay time is greater than a delay threshold time $\tau_{MV}$, outputs a bit reliability decision signal;
   a digital noise reduction circuit that is selectively activated if the bit reliability decision signal indicates the detected delay time is greater than the delay threshold time $\tau_{MV}$ and produces a noise-reduced decision output that supersedes the decision output of the voltage comparator.

2. The ADC circuit of claim 1 wherein the the digital-to-analog converter (DAC) has a second analog output connected to the first analog input of the voltage comparator.

3. The ADC circuit of claim 1 wherein the digital noise reduction circuit uses a multiple voting logic to produce a majority vote value as the noise-reduced decision output.

4. The ADC circuit of claim 3 wherein the digital noise reduction circuit is configurable in a number of repeated votes (Nv) per bit decision used in the voting logic and a number of voting cycles (Nc) per conversion used in the voting logic.

5. The ADC circuit of claim 4 further comprising a feedback circuit that controls $\tau_{MV}$ of the bit reliability circuit based in part on the number of voting cycles (Nc) per conversion.

6. The ADC circuit of claim 3 further comprising an oscillation circuit that generates a variable over-sampled clock signal for the multiple voting logic.

* * * * *